(12) United States Patent
Yang et al.

(10) Patent No.: US 11,515,373 B2
(45) Date of Patent: Nov. 29, 2022

(54) OLED SUBSTRATE, PHOTO MASK, AND METHOD OF MANUFACTURING OLED SUBSTRATE

(71) Applicants: Chengdu BOE Optoelectronics Technology Co., Ltd., Sichuan (CN); Beijing BOE Technology Development Co., Ltd., Beijing (CN)

(72) Inventors: Bowen Yang, Beijing (CN); Fei Xie, Beijing (CN); Chengguo An, Beijing (CN); Yubin Song, Beijing (CN); Yudong Shang, Beijing (CN); Pengsha Ma, Beijing (CN); Xiaodong Yang, Beijing (CN); Junjiao Chen, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 168 days.

(21) Appl. No.: 16/833,863

(22) Filed: Mar. 30, 2020

(65) Prior Publication Data
US 2021/0020713 A1    Jan. 21, 2021

(30) Foreign Application Priority Data
Jul. 19, 2019   (CN) .......................... 201910654107.0

(51) Int. Cl.
*H01L 27/32*   (2006.01)
*H01L 51/56*   (2006.01)

(52) U.S. Cl.
CPC ...... *H01L 27/3246* (2013.01); *H01L 27/3283* (2013.01); *H01L 51/56* (2013.01)

(58) Field of Classification Search
CPC .. H01L 27/3246; H01L 27/3283; H01L 51/56
See application file for complete search history.

(56) References Cited

U.S. PATENT DOCUMENTS

| 7,710,015 B2 | 5/2010 | Matsudate et al. |
| 8,609,442 B2 | 12/2013 | Inoue et al. |

(Continued)

FOREIGN PATENT DOCUMENTS

| CN | 1681363 A | 10/2005 |
| CN | 103189542 A | 7/2013 |

(Continued)

OTHER PUBLICATIONS

First Office Action, including search report, for Chinese Patent Application No. 201910654107.0, dated Dec. 23, 2020, 16 pages.

*Primary Examiner* — Fernando L Toledo
*Assistant Examiner* — Neil R Prasad
(74) *Attorney, Agent, or Firm* — Westman, Champlin & Koehler, P.A.

(57) ABSTRACT

The resent disclosure provides an OLED substrate, a photo mask, and a method of manufacturing the OLED substrate. In one embodiment, an OLED substrate includes: a base substrate; an anode layer on the base substrate; a pixel defining layer on the anode layer, the pixel defining layer having a pattern opening area, the pattern opening area including a plurality of pixel openings arranged in an array manner; and a light-emitting layer formed on the pixel defining layer by evaporation; wherein the pattern opening area has an inward contraction structure with respect to a regular pixel opening area structure in which a plurality of pixel openings are arranged in a manner of an regular array where rows in the regular array are equally spaced from each (Continued)

(a)　　　　(b)　　　　(c)

other and are parallel to each other and columns in the regular array are equally spaced from each other and are parallel to each other.

13 Claims, 4 Drawing Sheets

(56) References Cited

U.S. PATENT DOCUMENTS

| | | | |
|---|---|---|---|
| 2003/0061593 A1* | 3/2003 | Yotsuya | C23C 14/042 |
| | | | 438/455 |
| 2005/0236970 A1 | 10/2005 | Matsudate et al. | |
| 2007/0048436 A1 | 3/2007 | Kang et al. | |
| 2013/0196454 A1 | 8/2013 | Inoue et al. | |
| 2016/0056218 A1* | 2/2016 | Wang | H01L 27/3246 |
| | | | 438/34 |
| 2019/0010601 A1* | 1/2019 | Lin | C23C 14/24 |
| 2019/0372002 A1* | 12/2019 | Yamabuchi | H01L 51/56 |

FOREIGN PATENT DOCUMENTS

| | | |
|---|---|---|
| CN | 103760747 A | 4/2014 |
| CN | 108441817 A | 8/2018 |

* cited by examiner

OLED SUBSTRATE, PHOTO MASK, AND METHOD OF MANUFACTURING OLED SUBSTRATE

CROSS-REFERENCE TO RELATED APPLICATION

This application claims priority to Chinese Patent Application No. 201910654107.0 filed on Jul. 19, 2019 in the State Intellectual Property Office of China, the disclosure of which is hereby incorporated by reference in its entirety.

TECHNICAL FIELD

The present disclosure relates to the field of display technology, and particularly, to an OLED substrate, a photo mask, and a method of manufacturing the OLED substrate.

BACKGROUND

In an OLED device, an organic light-emitting material is evaporated on a substrate through a mask.

SUMMARY

According to an aspect of the present disclosure, there is provided an OLED substrate comprising:
 a base substrate;
 an anode layer on the base substrate;
 a pixel defining layer on the anode layer, wherein the pixel defining layer has a pattern opening area, and the pattern opening area includes a plurality of pixel openings arranged in an array manner; and
 a light-emitting layer formed on the pixel defining layer by evaporation;
 wherein the pattern opening area has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other.

In some embodiments, an inward contraction amount of the pattern opening area in the pixel defining layer is determined according to a preset inward contraction amount and evaporation conditions.

In some embodiments, the preset inward contraction amount for a current evaporation is an inward contraction amount of the pattern opening area of the pixel defining layer with respect to the regular pixel opening area structure during the previous evaporation of which a evaporation conditions are comparable or similar to the evaporation conditions during the current evaporation.

In some embodiments, the evaporation conditions comprise an evaporation temperature, wherein the higher the evaporation temperature is, the larger the inward contraction amount is.

In some embodiments, the inward contraction amount comprises an inward contraction amount in a first unidirectional direction and an inward contraction amount in a second unidirectional direction, the pattern opening area of the pixel defining layer comprises a first section, a middle section and a second section in that order in the second unidirectional direction, a connection line between a center of the first section and a center of the second section is parallel to the first unidirectional direction, the first section has the inward contraction amount in the second unidirectional direction, the second section has the inward contraction amount in the first unidirectional direction, and the inward contraction amount of the first section is the same as the inward contraction amount of the second section;
 the inward contraction amount of a portion of the first section close to the middle section in the second unidirectional direction is less than the inward contraction amount of a portion of the first section far away from the middle section in the second unidirectional direction, the middle section has a first central axis perpendicular to the first unidirectional direction, the middle section has a structure that is symmetrical about the first central axis, the inward contraction amount of the middle section is also symmetrical about the first central axis, and the inward contraction amount of a portion of the second section close to the middle section in the first unidirectional direction is less than the inward contraction amount of a portion of the second section far away from the middle section in the first unidirectional direction; and
 the first unidirectional direction is opposite to the second unidirectional direction.

In some embodiments, the inward contraction amount comprises an inward contraction amount in a third unidirectional direction and an inward contraction amount in a fourth unidirectional direction, the pattern opening area of the pixel defining layer comprises a third section, a fourth section and a fifth section in that order in the third unidirectional direction, a connection line between a center of the third section and a center of the fifth section is parallel to the third unidirectional direction, the third section has the inward contraction amount in the third unidirectional direction, the fifth section has the inward contraction amount in the fourth unidirectional direction, and the inward contraction amount of the third section is the same as the inward contraction amount of the fifth section;
 the inward contraction amount of a portion of the third section close to the fourth section in the third unidirectional direction is less than the inward contraction amount of a portion of the third section far away from the fourth section in the third unidirectional direction, the fourth section has a second central axis perpendicular to the third unidirectional direction, the fourth section has a structure that is symmetrical about the second central axis, the inward contraction amount of the fourth section is also symmetrical about the second central axis, and the inward contraction amount of a portion of the fifth section close to the fourth section in the fourth unidirectional direction is less than the inward contraction amount of a portion of the fifth section far away from the fourth section in the fourth unidirectional direction; and
 the first unidirectional direction is perpendicular to the third unidirectional direction, and the third unidirectional direction is opposite to the fourth unidirectional direction.

In some embodiments, the inward contraction amount of an overlap portion of the first section and the third section in the second unidirectional direction is less than the inward contraction amount of an overlap portion of the first section and the fourth section in the second unidirectional direction, the inward contraction amount of an overlap portion of the first section and the fifth section in the second unidirectional direction is less than an the inward contraction amount of an overlap portion of the first section and the fourth section in the second unidirectional direction, and the inward contraction amount of an overlap portion of the first section and the third section in the second unidirectional direction is the same as the inward contraction amount of an overlap portion of the first section and the fifth section in the second unidirectional direction.

In some embodiments, the inward contraction amount of an overlap portion of the second section and the third section in the first unidirectional direction is less than the inward contraction amount of an overlap portion of the second section and the fourth section in the first unidirectional direction, the inward contraction amount of an overlap portion of the second section and the fifth section in the first unidirectional direction is less than an the inward contraction amount of an overlap portion of the second section and the fourth section in the first unidirectional direction, and the inward contraction amount of an overlap portion of the second section and the third section in the first unidirectional direction is the same as the inward contraction amount of an overlap portion of the second section and the fifth section in the first unidirectional direction.

In some embodiments, the inward contraction amount of an overlap portion of the third section and the first section in the third unidirectional direction is less than the inward contraction amount of an overlap portion of the third section and the middle section in the third unidirectional direction, the inward contraction amount of an overlap portion of the third section and the second section in the third unidirectional direction is less than an the inward contraction amount of an overlap portion of the third section and the middle section in the third unidirectional direction, and the inward contraction amount of an overlap portion of the third section and the first section in the third unidirectional direction is the same as the inward contraction amount of an overlap portion of the third section and the second section in the third unidirectional direction.

In some embodiments, the inward contraction amount of an overlap portion of the fifth section and the first section in the fourth unidirectional direction is less than the inward contraction amount of an overlap portion of the fifth section and the middle section in the fourth unidirectional direction, the inward contraction amount of an overlap portion of the fifth section and the second section in the fourth unidirectional direction is less than an the inward contraction amount of an overlap portion of the fifth section and the middle section in the fourth unidirectional direction, and the inward contraction amount of an overlap portion of the fifth section and the first section in the fourth unidirectional direction is the same as the inward contraction amount of an overlap portion of the fifth section and the second section in the fourth unidirectional direction.

According to another aspect of the present disclosure, there is provided a photo mask for manufacturing the OLED substrate of any one of the abovementioned embodiments, the photo mask is divided into a first region, a second region and a third region, the photo mask comprises a light shield part and a light transmission part, the light shield part has a compensation pattern that is the same as a pattern of the pattern opening area of the pixel defining layer;

wherein the compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer; and wherein the first compensation pattern is located within the first region, the second compensation pattern is located within the second region, and the third compensation pattern is located within the third region.

According to yet another aspect of the present disclosure, there is provided a method of manufacturing an OLED substrate, and the method comprises:

providing a base substrate;

forming an anode layer on the base substrate;

forming a pixel defining layer on the anode layer;

forming a photosensitive layer on the pixel defining layer, and exposing and developing the photosensitive layer;

etching the pixel defining layer to form an pattern opening area of the pixel defining layer, wherein the pattern opening area including a plurality of pixel openings arranged in an array manner, the pattern opening area has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other.

In some embodiments, exposing the photosensitive layer further comprises:

disposing a photo mask above the photosensitive layer, wherein the photo mask is divided into a first region, a second region and a third region, the photo mask comprises a light shield part and a light transmission part, the light shield part has a compensation pattern that is the same as a pattern of the pattern opening area of the pixel defining layer; wherein the compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer; and wherein the first compensation pattern is located within the first region, the second compensation pattern is located within the second region, and the third compensation pattern is located within the third region;

exposing the photosensitive layer with the first region of the photo mask, such that a portion of the photosensitive layer corresponding to a portion of the light transmission part within the first region of the photo mask is denatured;

exposing the photosensitive layer with the second region of the photo mask, such that a portion of the photosensitive layer corresponding to a portion of the light transmission part within the second region of the photo mask is denatured; and exposing the photosensitive layer with the third region of the photo mask, such that a portion of the photosensitive layer corresponding to a portion of the light transmission part within the third region of the photo mask is denatured.

In some embodiments, after exposing the photosensitive layer with the third region of the photo mask, the method further comprises: etching away an undenatured portion of the photosensitive layer, to form an etched photosensitive layer; and etching the pixel defining layer, to form an etched pixel defining layer having a same shape as the etched photosensitive layer.

In some embodiments, after etching the pixel defining layer, the method further comprises: stripping the etched photosensitive layer, to form the pixel defining layer having the pattern opening area.

The above description is only an overview of the technical solutions of the present disclosure. In order to better understand the technical means of the present disclosure, it can be implemented in accordance with the contents of the description, and in order to make the above and other objects, features, and advantages of the present disclosure more comprehensible, specific embodiments of the present disclosure are specifically described in the following.

DETAILED DESCRIPTION OF THE EMBODIMENTS

In order to further explain the technical means and effects adopted by the present disclosure to achieve the intended purpose of the present disclosure, specific implementations, structures, features and effects of an OLED substrate and a method of manufacturing an OLED substrate according to the present disclosure are described in detail below with reference to the accompanying drawings and exemplary embodiments.

Figure 1:
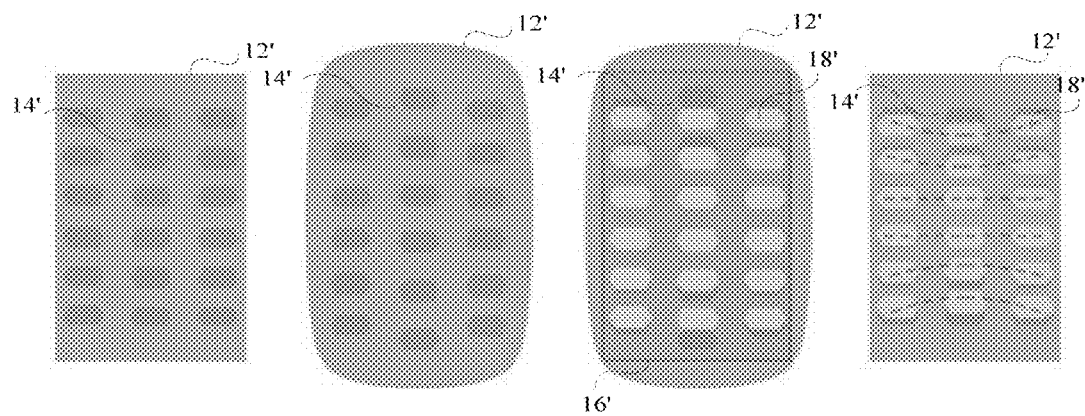
FIG. 1 is a schematic view showing an evaporation process in related art.

In related art, as shown in FIG. 1, most OLED materials need to be evaporated to a specified position on the surface of the device through evaporation equipment. However, the environmental temperature will rise during evaporation, and the glass substrate 12' carried with the anode layer and the pixel defining layer is different in expansion rate from the mask 16', which will reduce the matching accuracy of the position between the pattern of the mask 16' and the pattern of the pattern opening area 14' of the pixel defining layer of the glass substrate 12', resulting in that there is a large position deviation between the evaporated material 18' and the pattern opening area 14' of the pixel defining layer that should be covered after evaporation in some areas, and thus causing abnormal color mixing and affecting product yield. Therefore, how to reduce the position deviation between the evaporation material and the pixel defining layer has become an urgent problem. It should be noted that, in FIG. 1, since the anode layer and the pixel defining layer provided stackedly on the glass substrate expand together with the glass substrate during evaporation (that is, they have the same expansion rate as the glass substrate), in FIG. 1, only the glass substrate is shown with the reference numeral "12'", and the anode layer and the pixel defining layer are not shown with the reference numerals for the purpose of clarity. Also, in FIG. 1, darker colored hexagons represent the pixel openings in the pattern opening area of the pixel defining layer, and lighter colored hexagons represent the evaporation material that is evaporated onto the pixel defining layer through the mask for the purpose of clarity. In addition, in FIG. 1, the dotted line indicates the position change of the evaporation material with respect to the pixel opening in the pattern opening area of the pixel defining layer after the evaporation is completed.

Figure 2:
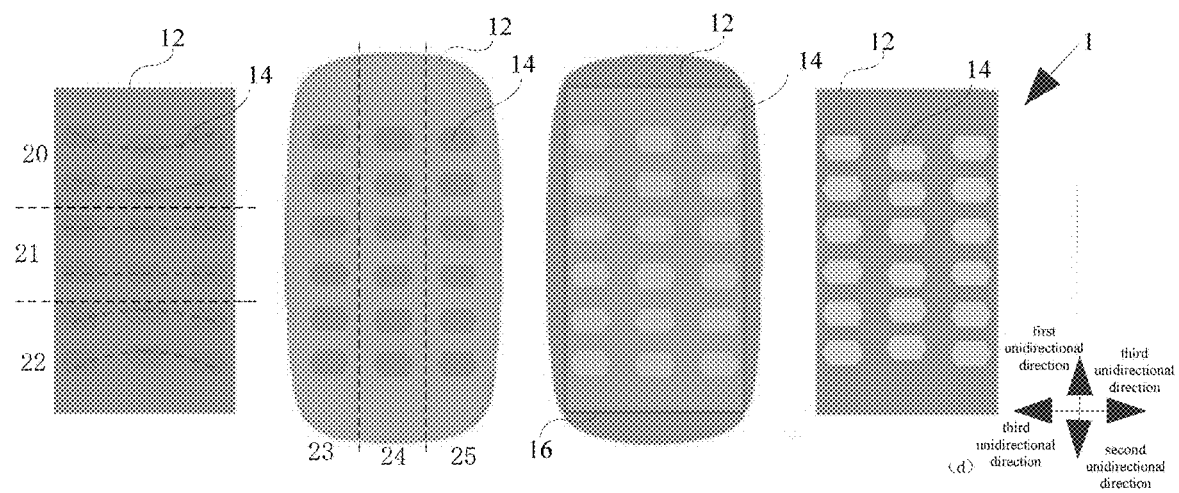
FIG. 2 is a schematic view showing an evaporation process according to an embodiment of the present disclosure.

As shown in FIG. 2, according to embodiments of the present disclosure, there is provided an OLED substrate 1. The OLED substrate 1 includes a base substrate (for example, glass substrate) 12; an anode layer on the base substrate; a pixel defining layer on the anode layer, the pixel defining layer having an pattern opening area 14, the pattern opening area 14 including a plurality of pixel openings arranged in an array manner; and a light-emitting layer formed on the pixel defining layer by evaporation; wherein the pattern opening area 14 has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other. For example, "regular pixel opening area structure" mentioned herein may be a pixel opening area structure of a conventional pixel defining layer in the related art, as shown in FIG. 1.

As shown in FIG. 2, in the manufacture of the OLED substrate 1, the OLED material needs to be evaporated onto the pixel defining layer through a mask 16 to form a light-emitting layer, but the glass substrate 12 carried with the pixel defining layer and the mask 16 for evaporation of the OLED material onto the pixel defining layer have different expansion rates. During evaporation, the pattern opening area 14 of the pixel defining layer on the glass substrate 12 and the evaporation opening region of the mask 16 are thermally expanded. Since the expansion rate of the glass substrate 12 is different from that of the mask 16, the expansion amount of the pattern opening area 14 of the pixel defining layer on the glass substrate 12 is different from that of the evaporation opening area of the mask 16. Therefore, after the evaporation is completed, the position of the evaporation opening area of the mask 16 is significantly different from the position of the pattern opening area 14 of the pixel defining layer on the glass substrate 12, which may easily lead to abnormal color mixing and affect product yield.

In the OLED substrate 1 according to the embodiments of the present disclosure, the pattern opening area 14 of the pixel defining layer is configured to have an inward contraction structure with respect to a regular pixel opening area structure. During evaporation, since the pattern opening area 14 of the pixel defining layer has an inward contraction structure with respect to a regular pixel opening area structure, the position of the pattern opening area 14 of the expanded pixel defining layer coincides with the position of the evaporation opening area of the expanded mask 16, and thus the light emitting layer evaporated through the mask 16 onto the pixel defining layer coincides with the pixel opening within the pattern opening area 14 of the pixel defining layer, so that the abnormal color mixing and the product yield can be improved.

It should be noted that, in the embodiments of the present disclosure, since the anode layer and the pixel defining layer provided stackedly on the glass substrate expand together with the glass substrate during evaporation (that is, they have the same expansion rate as the glass substrate), in the drawings of the present disclosure, only the glass substrate is shown with the reference numeral "12", and the anode layer and the pixel defining layer are not shown with the reference numerals for the purpose of clarity. Similarly, in the embodiments of the present disclosure, since the position of the pattern opening area of the pixel defining layer coincides with the position of the evaporation opening area of the mask during evaporation, in the drawings of the present disclosure, only the pattern opening area of the pixel defining layer is shown with the reference numeral "14", and the evaporation opening area of the mask is not shown with the reference numerals for the purpose of clarity. In addition, in the drawings of the present disclosure, darker colored hexagons represent the pixel openings in the pattern opening area of the pixel defining layer, and lighter colored hexagons represent the evaporation material that is evaporated onto the pixel defining layer through the mask for the purpose of clarity.

The present disclosure will be further described in detail below with reference to the accompanying drawings and exemplary embodiments.

In an embodiment of the present disclosure, when the expansion rate of the glass substrate 12 is greater than that of the mask 16, the expansion amount of the pattern opening area 14 of the pixel defining layer and the anode layer on the glass substrate 12 is greater than that of the evaporation opening area of the mask 16. In this case, the pattern opening area 14 of the pixel defining layer is configured to have an inward contraction structure with respect to the regular pixel opening area structure. During evaporation, since the pattern opening area 14 of the pixel defining layer has the inward contraction structure with respect to the regular pixel opening area structure, the position of the pattern opening area 14 of the expanded pixel defining layer and the position of the evaporation opening area of the expanded mask 16 coincide with each other, and then the light-emitting layer evaporated on the pixel defining layer by the mask 16 coincides with the pattern opening area 14 of the pixel defining layer, which increases the product yield.

It should be noted that the term "inward contraction" in the present disclosure means that rows and columns formed by the pixel openings are bent toward a center of the pixel opening area, and the term "inward contraction amount" to be described below means a degree of the bending.

In the embodiment of the present disclosure, an inward contraction amount of the pattern opening area 14 in the pixel defining layer is determined according to a preset inward contraction amount and evaporation conditions. The preset inward contraction amount is an inward contraction amount of the pattern opening area 14 of the pixel defining layer with respect to the regular pixel opening area structure during the previous evaporation in which the evaporation conditions are comparable or similar to the evaporation conditions during the current evaporation. The evaporation conditions are these conditions that affect the expansion rate of the glass substrate 12 or the mask 16 during the evaporation process. Based on the preset inward contraction amount, the preset inward contraction amount is adjusted according to the difference between the current evaporation conditions and the previous evaporation conditions, to obtain the inward contraction amount of the pattern opening area 14 of the pixel defining layer.

In the embodiment of the present disclosure, the evaporation conditions comprise an evaporation temperature. The higher the evaporation temperature is, the larger the inward contraction amount of the pattern opening area 14 of the pixel defining layer is. As a result, the inward contraction amount of the pattern opening area 14 of the pixel defining layer can be determined based on the evaporation temperature.

In some embodiments, when there is a difference between the evaporation temperature during the previous evaporation and the evaporation temperature during the current evaporation, the preset inward contraction amount can be adjusted according to the temperature difference, so as to determine the inward contraction amount of the pattern opening area 14 of the pixel defining layer.

In some embodiments, the inward contraction amount comprises an inward contraction amount in a first unidirectional direction and an inward contraction amount in a second unidirectional direction, the pattern opening area 14 of the pixel defining layer comprises a first section 20, a middle section 21 and a second section 22 in that order in the second unidirectional direction, a connection line between a center of the first section 20 and a center of the second section 22 is parallel to the first unidirectional direction, the first section 20 has the inward contraction amount in the second unidirectional direction, the second section 22 has the inward contraction amount in the first unidirectional direction, and the inward contraction amount of the first section 20 is the same as the inward contraction amount of the second section 22.

The inward contraction amount of a portion of the first section 20 close to the middle section 21 in the second unidirectional direction is less than the inward contraction amount of a portion of the first section 20 far away from the middle section 21 in the second unidirectional direction. The middle section 21 has a first central axis perpendicular to the first unidirectional direction, the middle section 21 has a structure that is symmetrical about the first central axis, and the inward contraction amount of the middle section 21 is also symmetrical about the first central axis. That is, the inward contraction amount of a portion of the middle section 21 close to the first section 20 in the first unidirectional direction is equal to the inward contraction amount of a portion of the middle section 21 far away from the first section 20 in the first unidirectional direction. The inward contraction amount of a portion of the second section 22 close to the middle section 21 in the first unidirectional direction is less than the inward contraction amount of a portion of the second section far away from the middle section 21 in the first unidirectional direction.

The first unidirectional direction is opposite to the second unidirectional direction.

In some embodiments, the inward contraction amount comprises an inward contraction amount in a third unidirectional direction and an inward contraction amount in a fourth unidirectional direction, the pattern opening area 14 of the pixel defining layer comprises a third section 23, a fourth section 24 and a fifth section 25 in that order in the third unidirectional direction, a connection line between a center of the third section 23 and a center of the fifth section 25 is parallel to the third unidirectional direction, the third section 23 has the inward contraction amount in the third unidirectional direction, the fifth section 25 has the inward contraction amount in the fourth unidirectional direction, and the inward contraction amount of the third section 23 is the same as the inward contraction amount of the fifth section 25.

The inward contraction amount of a portion of the third section 23 close to the fourth section 24 in the third unidirectional direction is less than the inward contraction amount of a portion of the third section 23 far away from the fourth section 24 in the third unidirectional direction. The fourth section 24 has a second central axis perpendicular to the third unidirectional direction, the fourth section 24 has a structure that is symmetrical about the second central axis, the inward contraction amount of the fourth section 24 is also symmetrical about the second central axis. That is, the inward contraction amount of a portion of the fourth section 24 close to the third section 23 in the third unidirectional direction is equal to the inward contraction amount of a portion of the fourth section 24 far away from the third section 23 in the third unidirectional direction. The inward contraction amount of a portion of the fifth section 25 close to the fourth section 24 in the fourth unidirectional direction is less than the inward contraction amount of a portion of the fifth section 25 far away from the fourth section 24 in the fourth unidirectional direction.

The first unidirectional direction is perpendicular to the third unidirectional direction, and the third unidirectional direction is opposite to the fourth unidirectional direction.

In the present embodiment, the inward contraction amount includes the inward contraction amount in the first unidirectional direction, the inward contraction amount in the third unidirectional direction, the inward contraction amount in the second unidirectional direction, and the inward contraction amount in the fourth unidirectional direction. As shown in FIG. 2, the direction with vertical upward arrow is the first unidirectional direction, the direction with vertical downward arrow is the second unidirectional direction, the direction with horizontal right arrow is the third unidirectional direction, and the direction with horizontal left arrow is the fourth unidirectional direction. The first unidirectional direction is opposite to the second unidirectional direction, and the third unidirectional direction is opposite to the fourth unidirectional direction. In the embodiments of the present disclosure, the pattern opening area 14 of the pixel defining layer is configured as the inward contraction structure with respect to the regular pixel opening area structure. For example, the pattern opening area 14 of the pixel defining layer includes the first section 20, the middle section 21, and the second section 22, that is, the pattern opening area 14 of the pixel defining layer is composed of the first section 20, the middle section 21, and the second section 22. The first section 20 has the inward contraction amount in the second unidirectional direction, the second section 22 has the inward contraction amount in the first unidirectional direction, and the inward contraction amount of the first section 20 is the same as the inward contraction amount of the second section 22. As a result, after the glass substrate 12 is thermally expanded, due to the changes of inward contraction amounts of the first section 20 in the first unidirectional direction and the second section 22 in the second unidirectional direction in the pattern opening area 14 of the pixel defining layer, the pattern opening area 14 of the expanded pixel defining layer in the first unidirectional direction and the second unidirectional direction coincides with the evaporation opening area of the expanded mask 16 in the first unidirectional direction and the second unidirectional direction. Due to the changes of inward contraction amounts of the third section 23 in the third unidirectional direction and the fifth section 25 in the fourth unidirectional direction in the pattern opening area 14 of the pixel defining layer, the pattern opening area 14 of the expanded pixel defining layer in the third unidirectional direction and the fourth unidirectional direction coincides with the evaporation opening area of the expanded mask 16 in the third unidirectional direction and the fourth unidirectional direction. As a result, the light-emitting layer evaporated on the pattern opening area 14 of the pixel defining layer by the mask 16 coincides with the pattern opening area 14 of the pixel defining layer, thereby improving the product yield.

In the embodiments of the present disclosure, more specifically, the inward contraction amount of an overlap portion of the first section 20 and the third section 23 in the second unidirectional direction is less than the inward contraction amount of an overlap portion of the first section 20 and the fourth section 24 in the second unidirectional direction, the inward contraction amount of an overlap portion of the first section 20 and the fifth section 25 in the second unidirectional direction is less than an the inward contraction amount of an overlap portion of the first section 20 and the fourth section 24 in the second unidirectional direction, and the inward contraction amount of an overlap portion of the first section 20 and the third section 23 in the second unidirectional direction is the same as the inward contraction amount of an overlap portion of the first section 20 and the fifth section 25 in the second unidirectional direction.

The inward contraction amount of an overlap portion of the second section 22 and the third section 23 in the first unidirectional direction is less than the inward contraction amount of an overlap portion of the second section 22 and the fourth section 24 in the first unidirectional direction, the inward contraction amount of an overlap portion of the second section 22 and the fifth section 25 in the first unidirectional direction is less than an the inward contraction amount of an overlap portion of the second section 22 and the fourth section 24 in the first unidirectional direction, and the inward contraction amount of an overlap portion of the second section 22 and the third section 23 in the first unidirectional direction is the same as the inward contraction amount of an overlap portion of the second section 22 and the fifth section 25 in the first unidirectional direction.

The inward contraction amount of an overlap portion of the third section 23 and the first section 20 in the third unidirectional direction is less than the inward contraction amount of an overlap portion of the third section 23 and the middle section 21 in the third unidirectional direction, the inward contraction amount of an overlap portion of the third section 23 and the second section 22 in the third unidirectional direction is less than an the inward contraction amount of an overlap portion of the third section 23 and the middle section 21 in the third unidirectional direction, and the inward contraction amount of an overlap portion of the third section 23 and the first section 20 in the third unidirectional direction is the same as the inward contraction amount of an overlap portion of the third section 23 and the second section 22 in the third unidirectional direction.

The inward contraction amount of an overlap portion of the fifth section 25 and the first section 20 in the fourth unidirectional direction is less than the inward contraction amount of an overlap portion of the fifth section 25 and the middle section 21 in the fourth unidirectional direction, the inward contraction amount of an overlap portion of the fifth section 25 and the second section 22 in the fourth unidirectional direction is less than an the inward contraction amount of an overlap portion of the fifth section 25 and the middle section 21 in the fourth unidirectional direction, and the inward contraction amount of an overlap portion of the fifth section 25 and the first section 20 in the fourth unidirectional direction is the same as the inward contraction amount of an overlap portion of the fifth section 25 and the second section 22 in the fourth unidirectional direction.

In another aspect, according to embodiments of the present disclosure, there is further provided a photo mask for manufacturing the OLED substrate according to any one of the abovementioned embodiments. The photo mask is divided into a first region, a second region and a third region, and the photo mask comprises a light shield part and a light transmission part, and the light shield part has a compensation pattern that is the same as a pattern of the pattern opening area of the pixel defining layer. The compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer. The first compensation pattern is located within the first region, the second compensation pattern is located within the second region, and the third compensation pattern is located within the third region.

In the embodiment, an OLED substrate is manufactured with the photo mask having a compensation pattern, which has a compensation pattern that is the same as the pattern of the pattern opening area of the pixel-defining layer. As a result, the pattern opening area of the pixel defining layer in the manufactured OLED substrate is configured to have an inward contraction structure with respect to a regular pixel opening area structure, accordingly during evaporation the position of the pattern opening area 14 of the expanded pixel defining layer coincides with the position of the evaporation opening area of the expanded mask 16, and thus the light-emitting layer evaporated through the mask 16 onto the pixel defining layer coincides with the pixel opening within the pattern opening area 14 of the pixel defining layer, so that the position deviation between the light-emitting layer evaporated through the mask onto the pixel defining layer and the pattern opening area of the pixel defining layer in the related art is reduced, and thus the abnormal color mixing and the product yield can be improved.

Figure 4:
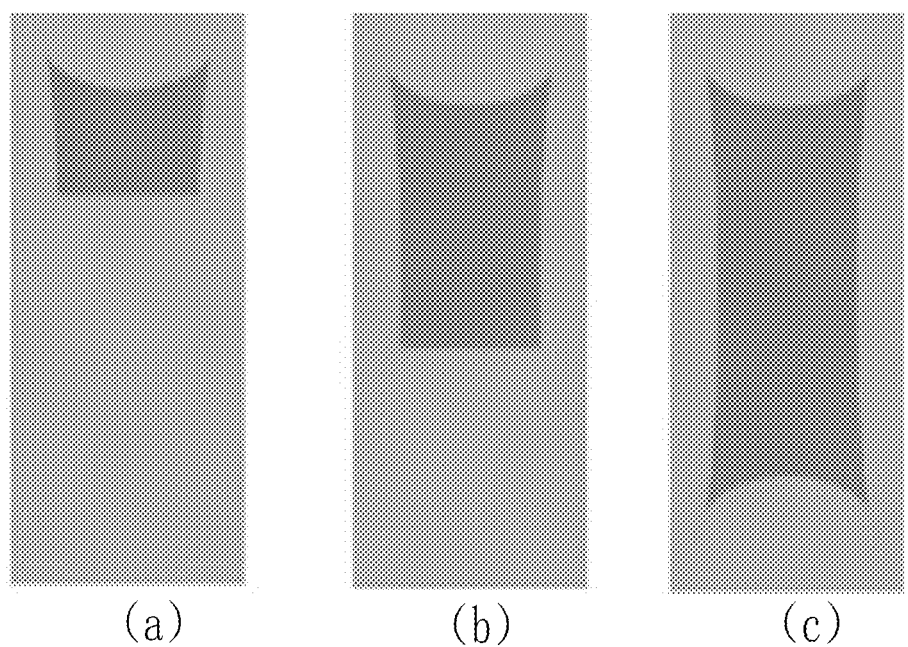
FIG. 4 is a schematic diagram showing a process of performing multiple exposures on a photosensitive layer through the photo mask according to an embodiment of the present disclosure.

In this embodiment, the photo mask may be an entire photo mask, or the entire photo mask may be set as a plurality of photo masks with small areas for multiple exposures. As shown in FIG. 4, the photo mask may include a first photo mask, a second photo mask, and a third photo mask. In FIG. 4, (a) shows an area formed after the first compensation pattern is exposed. The exposure is performed with the first photo mask to denature a region of the photosensitive layer corresponding to the first compensation pattern. In FIG. 4, (b) shows an area formed after the first compensation pattern and the second compensation pattern are exposed. The exposure with the first photo mask and the multiple exposures with the second photo mask are performed to denature a region of the photosensitive layer corresponding to the first compensation pattern and the second compensation pattern. In FIG. 4, (c) shows an area formed after the first compensation pattern, the second compensation pattern and the third compensation pattern are exposed. The exposure with the first photo mask, the multiple exposures with the second photo mask and the exposure with the third photo mask are performed to denature a region of the photosensitive layer corresponding to the first compensation pattern, the second compensation pattern and the third compensation pattern. In this way, the area of the photo mask is reduced while exposure intensity and uniformity of exposure are ensured.

In another aspect, according to embodiments of the present disclosure, there is further provided a method of manufacturing an OLED substrate. The method comprises: providing a base substrate; forming an anode layer on the base substrate; forming a pixel defining layer on the anode layer; forming a photosensitive layer on the pixel defining layer, and exposing and developing the photosensitive layer; etching the pixel defining layer to form an pattern opening area of the pixel defining layer, wherein the pattern opening area including a plurality of pixel openings arranged in an array manner, the pattern opening area has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other.

More specifically, exposing the photosensitive layer, further comprises: disposing a photo mask above the photosensitive layer, wherein the photo mask is divided into a first region, a second region and a third region, the photo mask comprises a light shield part and a light transmission part, the light shield part has a compensation pattern that is the same as a pattern of the pattern opening area of the pixel defining layer; wherein the compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer; and wherein the first compensation pattern is located within the first region, the second compensation pattern is located within the second region, and the third compensation pattern is located within the third region;

exposing the photosensitive layer with the first region of the photo mask, such that a portion of the photosensitive layer corresponding to a portion of the light transmission part within the first region of the photo mask is denatured;

exposing the photosensitive layer with the second region of the photo mask, such that a portion of the photosensitive layer corresponding to a portion of the light transmission part within the second region of the photo mask is denatured; and exposing the photosensitive layer with the third region of the photo mask, such that a portion of the photosensitive layer corresponding to a portion of the light transmission part within the third region of the photo mask is denatured.

Figure 5:
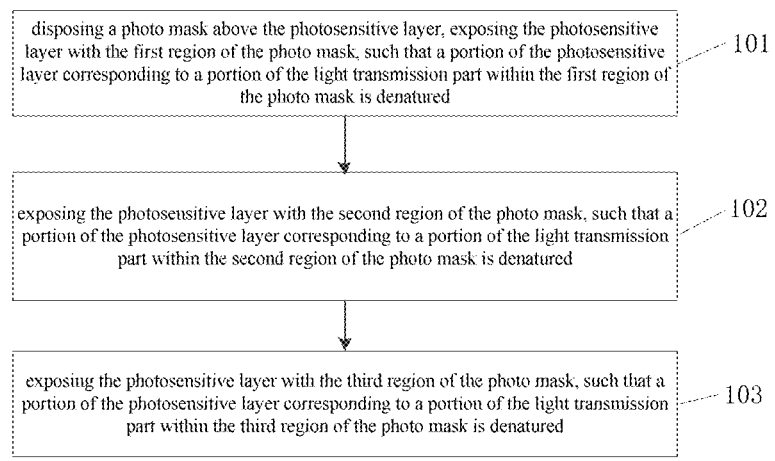
FIG. 5 is a flow diagram showing a method of manufacturing the OLED substrate according to an embodiment of the present disclosure.

According to embodiments of the present disclosure, when the exposure process is performed with the photo mask, one exposure performed with an entire photo mask can be replaced by multiple exposures performed with a plurality of small-area photo masks, to ensure exposure intensity and uniformity of exposure. Exemplarily, the photo mask further includes a first photo mask (equivalent to the first region of the entire photo mask), a second photo mask (equivalent to the second region of the entire photo mask), and a third photo mask (equivalent to the third region of the entire photo mask), and the method further comprises the following steps, as shown in FIG. 5.

In a step S101, the first photo mask is provided above the photosensitive layer, wherein the first photo mask has a first compensation pattern that is the same as the pattern of the first section of the pattern opening area of the pixel defining layer. The photosensitive layer is exposed with the first photo mask having the first compensation pattern, such that a portion of the photosensitive layer corresponding to the first compensation pattern is denatured.

According to embodiments of the present disclosure, the first exposure process is to expose the first compensation pattern that is the same as the pattern of the first section of the pattern opening area of the pixel defining layer. As shown in FIG. 2, in this embodiment, the pattern opening area 14 of the pixel defining layer comprises a first section 20, a middle section 21 and a second section 22 in that order in the second unidirectional direction. As shown in (a) of FIG. 2, the pattern in the first and second rows from top to bottom is the pattern of the first section 20 of the pattern opening area of the pixel defining layer. When the first photo mask has the first compensation pattern as the same as the pattern in the first and second rows, the region of the photosensitive layer corresponding to the first and second rows is denatured, and denaturation refers to the change in the properties of the material of the photosensitive layer to distinguish the exposed area from the unexposed area. In addition, in the embodiment shown in FIG. 3, the inward contraction pattern in the first to third rows from the top to the bottom is the first compensation pattern.

In a step S102, the second photo mask is provided above the photosensitive layer, wherein the second photo mask has second sub-compensation patterns each being the same as a part of a pattern of the middle section of the pattern opening area of the pixel defining layer. A plurality of same second sub-compensation patterns constitute a second compensation pattern that is the same as the pattern of the middle section of the pattern opening area of the pixel defining layer. Multiple exposures are performed on the photosensitive layer with the second photo mask having the second sub-compensation patterns, such that a portion of the photosensitive layer corresponding to the second compensation pattern is denatured.

As shown in FIG. 2, in this embodiment, the inward contraction amount of a portion of the first section 20 close to the middle section 21 is less than the inward contraction amount of a portion of the first section 20 far away from the middle section 21, and the inward contraction amount of a portion of the second section 22 close to the middle section 21 is less than the inward contraction amount of a portion of the second section 22 far away from the middle section 21. The inward contraction amount of a portion of the middle section 21 close to the first section 20 or the second section 22 is equal to the inward contraction amount of a portion of the middle section 21 far away from the first section 20 or the second section 22. Accordingly, in order to expose the middle section 21 of the pattern opening area of the pixel defining layer, multiple exposures can be performed with the photo mask having the second sub-compensation patterns each being the same as a part of a pattern of the middle section 21, until the second compensation pattern is completely exposed. The plurality of same second sub-compensation patterns constitute the second compensation pattern that is the same as the pattern of the middle section 21 of the pattern opening area of the pixel defining layer. The second exposure process is to expose the second compensation pattern that is the same as the pattern of the middle section 21 of the pattern opening area of the pixel defining layer. As shown in (a) of FIG. 2, the pattern in the third and fourth rows from top to bottom is the pattern of the middle section 21 of the pattern opening area of the pixel defining layer, and the pattern in the third or fourth row from top to bottom is a part of the pattern of the middle section 21 of the pattern opening area of the pixel defining layer. When the second photo mask has the second sub-compensation pattern that is the same as the pattern in the third or fourth row from top to bottom, two exposure processes are performed on the second sub-compensation pattern that is the same as the pattern in the third row, the region of the photosensitive layer corresponding to the third and fourth rows from top to bottom is denatured. In addition, in the embodiment shown in FIG. 3, the inward contraction pattern in the fourth row from the top to the bottom is the second compensation pattern.

In a step S103, the third photo mask is provided above the photosensitive layer, wherein the third photo mask has a third compensation pattern that is the same as the pattern of the second section of the pattern opening area of the pixel defining layer. The photosensitive layer is exposed with the third photo mask having the third compensation pattern, such that a portion of the photosensitive layer corresponding to the third compensation pattern is denatured.

In this embodiment, the third exposure process is to expose the third compensation pattern that is the same as the pattern of the second section 22 of the pattern opening area of the pixel defining layer. As shown in (a) of FIG. 2, the pattern in the fifth and sixth rows from top to bottom is the pattern of the second section 22 of the pattern opening area of the pixel defining layer. When the third photo mask has the third compensation pattern as the same as the pattern in the fifth and sixth rows, the region of the photosensitive layer corresponding to the pattern in the fifth and sixth rows is denatured. In addition, in the embodiment shown in FIG. 3, the inward contraction pattern in the fifth and sixth rows from the top to the bottom is the third compensation pattern.

Figure 3:
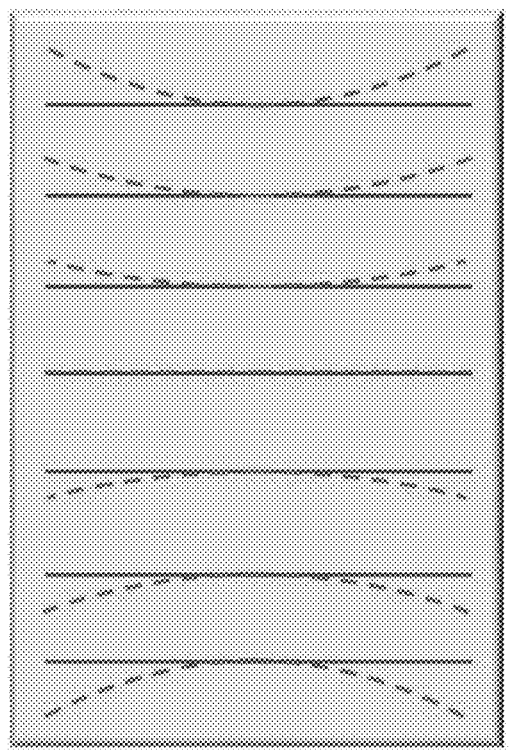
FIG. 3 is a comparison diagram of a pattern of the photo mask in the related art with an inward contraction pattern of a photo mask according to an embodiment of the present disclosure.

In FIG. 4, (a) shows an area formed after the first compensation pattern is exposed. The exposure is performed with the first photo mask to denature a region of the photosensitive layer corresponding to the first compensation pattern. In FIG. 4, (b) shows an area formed after the first compensation pattern and the second compensation pattern are exposed. The exposure with the first photo mask and the multiple exposures with the second photo mask are performed to denature a region of the photosensitive layer corresponding to the first compensation pattern and the second compensation pattern. In FIG. 4, (c) shows an area formed after the first compensation pattern, the second compensation pattern and the third compensation pattern are exposed. The exposure with the first photo mask, the multiple exposures with the second photo mask and the exposure with the third photo mask are performed to denature a region of the photosensitive layer corresponding to the first compensation pattern, the second compensation pattern and the third compensation pattern. In this way, the area of the photo mask is reduced while exposure intensity and uniformity of exposure are ensured. And when exposing the pattern of the middle portion that is uniformly set, second sub-compensation patterns each being the same as a part of the pattern of the middle section of the pattern opening area of the pixel defining layer may be formed in the second photo mask, so that multiple exposures are performed with the second photo mask, to denature a portion of the photosensitive layer corresponding to the second compensation pattern. Therefore, the method of manufacturing the OLED substrate according to the embodiments of the present disclosure can manufacture the OLED substrate as described above, in which the pattern opening area of the pixel defining layer has the inward contraction structure with respect to the regular pixel opening area structure, so that the position of the pattern opening area 14 of the expanded pixel defining pixel and the position of the evaporation opening area of the expanded mask 16 coincide with each other during evaporation. As shown in FIG. 3, the solid line is a pattern formed in a conventional photo mask, and the dashed line is a pattern formed in the photo mask according to the embodiments of the present disclosure, which is the same as the pattern in the patterned pixel defining layer.

In some embodiments, the photo mask is a quartz photo mask.

Figure 6:
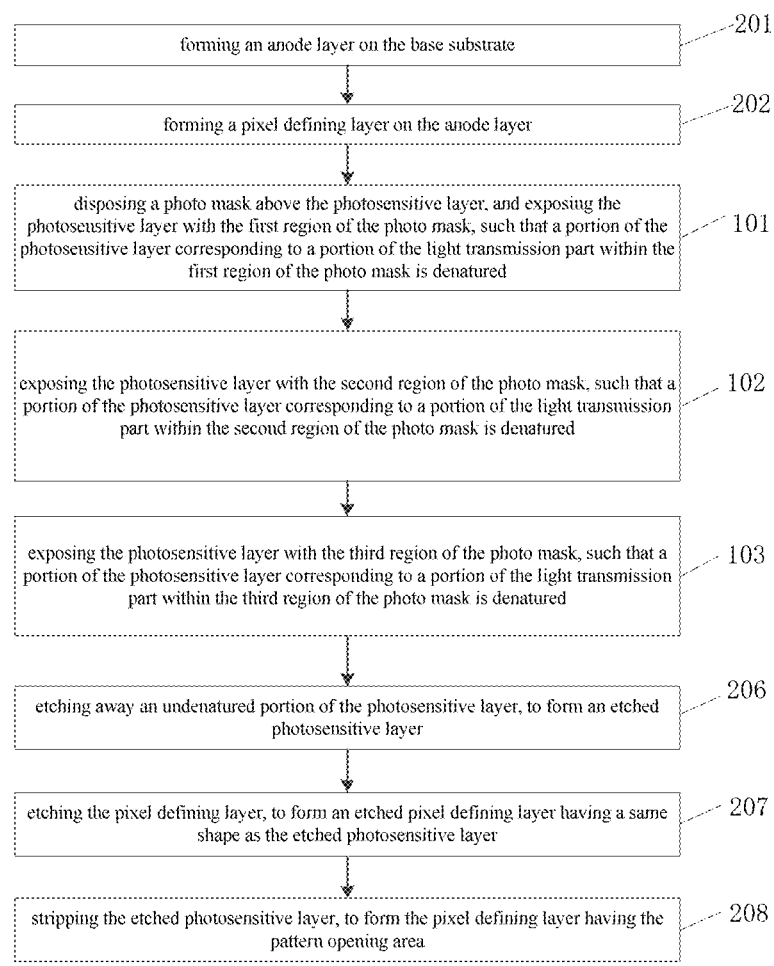
FIG. 6 is a detailed flow diagram showing the method of manufacturing the OLED substrate in FIG. 5.

Furthermore, as shown in FIG. 6, the abovementioned method, before the step S101, may further comprise the following steps.

A step S201 is to form an anode layer on a glass substrate, and to form the pixel defining layer on the anode layer.

A step S202 is to form the photosensitive layer on the pixel defining layer.

As shown in FIG. 6, the abovementioned method, after the step S103, may further comprise the following steps.

A step S206 is to etch away an undenatured portion of the photosensitive layer, to form an etched photosensitive layer.

A step S207 is to etch the pixel defining layer according to the etched photosensitive layer, to form an etched pixel defining layer having a same shape as the etched photosensitive layer.

A step S208 is to peel off the etched photosensitive layer, to form the pixel defining layer having the pattern opening area.

In the embodiments of the present disclosure, the pixel defining layer is provided on the bare anode layer, and then the photosensitive layer is provided on the pixel defining layer. Then, the first photo mask for exposure is provided above the photosensitive layer. The first photo mask has the first compensation pattern that is the same as pattern of the first section of the pattern opening area of the pixel defining layer, the photosensitive layer is exposed with the first photo mask, so that the region of the photosensitive layer corresponding to the first compensation pattern is denatured, while the region of the photosensitive layer not corresponding to the first compensation pattern is not denatured. Then, the photosensitive layer is exposed multiple times in turn through the second photo mask, so that the region of the photosensitive layer corresponding to the second compensation pattern is denatured, while the region of the photosensitive layer not corresponding to the second compensation pattern is not denatured. After the exposure of the second compensation pattern is completed, the third compensation pattern is exposed with the third photo mask, so that the region of the photosensitive layer corresponding to the third compensation pattern is denatured, while the region of the photosensitive layer not corresponding to the third compensation pattern is not denatured. In this way, the embodiments of the present disclosure realize that the pattern of the photosensitive layer that is the same as the pattern of the pattern opening area of the pixel defining layer is denatured by exposure of the first photo mask, multiple exposures of the second photo mask and exposure of the third photo mask, and then the undenatured region of the light sensitive layer is etched away (except for the denatured regions of the photosensitive layer, the rest are undenatured regions), thereby forming an etched photosensitive layer. After that, the pixel defining layer is etched according to the pattern of the etched photosensitive layer to form an etched pixel defining layer. After that the etched photosensitive layer is peeled off to form the pixel defining layer having the pattern opening area, here, the pattern opening area of the pixel defining layer is configured to have an inward contraction structure with respect to a regular pixel opening area structure. As a result, during evaporation, the position of the pattern opening area of the expanded pixel defining layer coincides with the position of the evaporation opening area of the expanded mask, and thus the light emitting layer evaporated through the mask onto the pixel defining layer coincides with the pixel opening within the pattern opening area of the pixel defining layer, so that the abnormal color mixing and the product yield can be improved.

The above are only specific implementations of the present disclosure, but the protection scope of the present disclosure is not limited to this. Those skilled in the art can easily envisage that changes or replacements within the technical scope disclosed in this disclosure should be within the protection scope of the present disclosure. Therefore, the protection scope of the present disclosure shall be subject to the protection scope of the claims.

What is claimed is:

1. An OLED substrate comprising:
a base substrate;
an anode layer on the base substrate;
a pixel defining layer on the anode layer, wherein the pixel defining layer has a pattern opening area, and the pattern opening area includes a plurality of pixel openings arranged in an array manner; and
a light-emitting layer formed on the pixel defining layer by evaporation;
wherein the pattern opening area has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other;
wherein an inward contraction amount of the pattern opening area in the pixel defining layer is determined according to a preset inward contraction amount and evaporation conditions; and
wherein the inward contraction amount comprises an inward contraction amount in a first unidirectional direction and an inward contraction amount in a second unidirectional direction, the pattern opening area of the pixel defining layer comprises a first section, a middle section and a second section in that order in the second unidirectional direction, a connection line between a center of the first section and a center of the second section is parallel to the first unidirectional direction, the first section has the inward contraction amount in the second unidirectional direction, the second section has the inward contraction amount in the first unidirectional direction, and the inward contraction amount of the first section is the same as the inward contraction amount of the second section;
the inward contraction amount of a portion of the first section close to the middle section in the second unidirectional direction is less than the inward contraction amount of a portion of the first section far away from the middle section in the second unidirectional direction, the middle section has a first central axis perpendicular to the first unidirectional direction, the middle section has a structure, that is symmetrical about the first central axis, the inward contraction amount of the middle section is also symmetrical about the first central axis, and the inward contraction amount of a portion of the second section close to the middle section in the first unidirectional direction is less than the inward contraction amount of a portion of the second section far away from the middle section in the first unidirectional directions and
the first unidirectional direction is opposite to the second unidirectional direction.

2. The OLED substrate of claim 1, wherein the preset inward contraction amount for a current evaporation is an inward contraction amount of the pattern opening area of the pixel defining layer with respect to the regular pixel opening area structure during a previous evaporation of which the evaporation conditions are comparable or similar to the evaporation conditions during the current evaporation.

3. The OLED substrate of claim 1, wherein the evaporation conditions comprise an evaporation temperature, wherein the higher the evaporation temperature is, the larger the inward contraction amount is.

4. The OLED substrate of claim 1, wherein
the inward contraction amount comprises an inward contraction amount in a third unidirectional direction and an inward contraction amount in a fourth unidirectional direction, the pattern opening area of the pixel defining layer comprises a third section, a fourth section and a fifth section in that order in the third unidirectional direction, a connection line between a center of the third section and a center of the fifth section is parallel to the third unidirectional direction, the third section has the inward contraction amount in the third unidirectional direction, the fifth section has the inward contraction amount in the fourth unidirectional direction, and the inward contraction amount of the third section is the same as the inward contraction amount of the fifth section;
the inward contraction amount of a portion of the third section close to the fourth section in the third unidirectional direction is less than the inward contraction amount of a portion of the third section far away from the fourth section in the third unidirectional direction, the fourth section has a second central axis perpendicular to the third unidirectional direction, the fourth section has a structure that is symmetrical about the second central axis, the inward contraction amount of the fourth section is also symmetrical about the second central axis, and the inward contraction amount of a portion of the fifth section close to the fourth section in the fourth unidirectional direction is less than the inward contraction amount of a portion of the fifth section far away from the fourth section in the fourth unidirectional direction; and
the first unidirectional direction is perpendicular to the third unidirectional direction, and the third unidirectional direction is opposite to the fourth unidirectional direction.

5. The OLED substrate of claim 4, wherein
the inward contraction amount of an overlap portion of the first section and the third section in the second unidirectional direction is less than the inward contraction amount of an overlap portion of the first section and the fourth section in the second unidirectional direction, the inward contraction amount of an overlap portion of the first section and the fifth section in the second unidirectional direction is less than an the inward contraction amount of an overlap portion of the first section and the fourth section in the second unidirectional direction, and the inward contraction amount of an overlap portion of the first section and the third section in the second unidirectional direction is the same as the inward contraction amount of an overlap portion of the first section and the fifth section in the second unidirectional direction.

6. The OLED substrate of claim 4, wherein
the inward contraction amount of an overlap portion of the second section and the third section in the first unidirectional direction is less than the inward contraction amount of an overlap portion of the second section and the fourth section in the first unidirectional direction, the inward contraction amount of an overlap portion of the second section and the fifth section in the first unidirectional direction is less than an the inward contraction amount of an overlap portion of the second section and the fourth section in the first unidirectional direction, and the inward contraction amount of an overlap portion of the second section and the third section in the first unidirectional direction is the same as the inward contraction amount of an overlap portion of the second section and the fifth section in the first unidirectional direction.

7. The OLED substrate of claim 4, wherein
the inward contraction amount of an overlap portion of the third section and the first section in the third unidirectional direction is less than the inward contraction amount of an overlap portion of the third section and the middle section in the third unidirectional direction, the inward contraction amount of an overlap portion of the third section and the second section in the third unidirectional direction is less than an the inward contraction amount of an overlap portion of the third section and the middle section in the third unidirectional direction, and the inward contraction amount of an overlap portion of the third section and the first section in the third unidirectional direction is the same as the inward contraction amount of an overlap portion of the third section and the second section in the third unidirectional direction.

8. The OLED substrate of claim 4, wherein
the inward contraction amount of an overlap portion of the fifth section and the first section in the fourth unidirectional direction is less than the inward contraction amount of an overlap portion of the fifth section and the middle section in the fourth unidirectional direction, the inward contraction amount of an overlap portion of the fifth section and the second section in the fourth unidirectional direction is less than an the inward contraction amount of an overlap portion of the fifth section and the middle section in the fourth unidirectional direction, and the inward contraction amount of an overlap portion of the fifth section and the first section in the fourth unidirectional direction is the same as the inward contraction amount of an overlap portion of the fifth section and the second section in the fourth unidirectional direction.

9. A photo mask for manufacturing the OLED substrate of claim 1, wherein the photo mask is divided into a first region, a second region and a third region, the photo mask comprises a light shield part and a light transmission part, the light shield part has a compensation pattern that is the same as a pattern of the pattern opening area of the pixel defining layer;
wherein the compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer; and
wherein the first compensation pattern is located within the first region, the second compensation pattern is located within the second region, and the third compensation pattern is located within the third region.

10. A method of manufacturing an OLED substrate, the method comprising:
 providing a base substrate;
 forming an anode layer on the base substrate;
 forming a pixel defining layer on the anode layer;
 forming a photosensitive layer on the pixel defining layer, and exposing and developing the photosensitive layer;
 etching the pixel defining layer to form an pattern opening area of the pixel defining layer, wherein the pattern opening area including a plurality of pixel openings arranged in an array manner, the pattern opening area has an inward contraction structure with respect to a regular pixel opening area structure in which a plurality of pixel openings are arranged in a manner of an regular array where rows in the regular array are equally spaced from each other and are parallel to each other and columns in the regular array are equally spaced from each other and are parallel to each other;
 wherein the inward contraction amount comprises an inward contraction amount in a first unidirectional direction and an inward contraction amount in a second unidirectional direction, the pattern opening area of the pixel defining layer comprises a first section, a middle section and a second section in that order in the second unidirectional direction, a connection line between a center of the first section and a center of the second section is parallel to the first unidirectional direction, the first section has the inward contraction amount in the second unidirectional direction, the second section has the inward contraction amount in the first unidirectional direction, and the inward contraction amount of the first section is the same as the inward contraction amount of the second section;
 the inward contraction amount of a portion of the first section close to the middle section in the second unidirectional direction is less than the inward contraction amount of a portion of the first section far away from the middle section in the second unidirectional direction the middle section has a first central axis perpendicular to the first unidirectional direction, the middle section has a structure that is symmetrical about the first central axis, the inward contraction amount of the middle section is also symmetrical about the first central axis, and the inward contraction amount of a portion of the second section close to the middle section in the first unidirectional direction is less than the inward contraction amount of a portion of the second section far away from the middle section in the first unidirectional direction; and
 the first unidirectional direction is opposite to the second unidirectional.

11. The method of claim 10, wherein exposing the photosensitive layer, further comprises:
 disposing a photo mask above the photosensitive layer, wherein the photo mask is divided into a first region, a second region and a third region, the photo mask comprises a light shield part and a light transmission part, the light shield part has a compensation pattern that is the same as a pattern of the pattern opening area of the pixel defining layer; wherein the compensation pattern comprises a first compensation pattern that is the same as a pattern of the first section of the pattern opening area of the pixel defining layer, a second compensation pattern that is the same as a pattern of the middle section of the pattern opening area of the pixel defining layer, and a third compensation pattern that is the same as a pattern of the second section of the pattern opening area of the pixel defining layer; and wherein the first compensation pattern is located within the first region, the second compensation pattern is located within the second region, and the third compensation pattern is located within the third region;
 exposing the photosensitive layer with the first region of the photo mask, such that a portion of the photosensitive layer corresponding to a portion of the light transmission part within the first region of the photo mask is denatured;
 exposing the photosensitive layer with the second region of the photo mask, such that a portion of the photosensitive layer corresponding to a portion of the light transmission part within the second region of the photo mask is denatured; and
 exposing the photosensitive layer with the third region of the photo mask, such that a portion of the photosensitive layer corresponding to a portion of the light transmission part within the third region of the photo mask is denatured.

12. The method of claim 11, wherein, after exposing the photosensitive layer with the third region of the photo mask, the method further comprises:
 etching away an undenatured portion of the photosensitive layer, to form an etched photosensitive layer; and
 etching the pixel defining layer, to form an etched pixel defining layer having a same shape as the etched photosensitive layer.

13. The method of claim 12, wherein, after etching the pixel defining layer, the method further comprises:
 stripping the etched photosensitive layer, to form the pixel defining layer having the pattern opening area.

* * * * *